United States Patent
Friedman et al.

(10) Patent No.: US 12,300,259 B2
(45) Date of Patent: May 13, 2025

(54) AUTOMATIC CLASSIFICATION OF AUDIO CONTENT AS EITHER PRIMARILY SPEECH OR PRIMARILY NON-SPEECH, TO FACILITATE DYNAMIC APPLICATION OF DIALOGUE ENHANCEMENT

(71) Applicant: Roku, Inc., San Jose, CA (US)

(72) Inventors: David Henry Friedman, Austin, TX (US); Alan Robert Bithell, Santa Clara, CA (US); Robert Caston Curtis, Napa, CA (US)

(73) Assignee: Roku, Inc., San Jose, CA (US)

( * ) Notice: Subject to any disclaimer, the term of this patent is extended or adjusted under 35 U.S.C. 154(b) by 497 days.

(21) Appl. No.: 17/654,339

(22) Filed: Mar. 10, 2022

(65) Prior Publication Data
US 2023/0290366 A1  Sep. 14, 2023

(51) Int. Cl.
*G10L 25/81*  (2013.01)
*G10L 15/08*  (2006.01)
(Continued)

(52) U.S. Cl.
CPC .............. *G10L 21/02* (2013.01); *G10L 15/08* (2013.01); *G10L 25/18* (2013.01)

(58) Field of Classification Search
CPC ......... G10L 21/02; G10L 15/08; G10L 25/18; G10L 2025/783; G10L 25/81; H03G 3/3089; H03G 7/007
See application file for complete search history.

(56) References Cited

U.S. PATENT DOCUMENTS 7,870,574 B2 * 1/2011 Kenyon ................. G10L 25/48
725/18
8,571,858 B2  10/2013 Fuchs et al.
(Continued)

FOREIGN PATENT DOCUMENTS

CN  111916089 A * 11/2020 ........... G06K 9/6221
WO  WO-2021041568 A1 * 3/2021 ......... G10L 21/0208
(Continued)

OTHER PUBLICATIONS

F. Eyben "Real-time Speech and Music Classification Using Large Audio Feature Space Extraction," Doctoral Thesis, The Technische Universität München, Germany, ISBN 978-3-319 27298-6, ISBN 978-3-319-27299-3 (eBook), DOI 10.1007/978-3-319-27299-3, Springer International Publishing, Switzerland (Year: 2016).*

(Continued)

*Primary Examiner* — Paras D Shah
*Assistant Examiner* — Mulugeta Tuji Dugda
(74) *Attorney, Agent, or Firm* — McDonnell Boehnen Hulbert & Berghoff LLP

(57) ABSTRACT

A method for dynamically controlling enhancement of an audio stream is provided, where the audio stream defines a sequence of audio segments over time. Each audio segment defines a waveform having a plurality of waveform attributes. For each audio segment of the sequence of audio segments, the method includes: (i) determining a set of waveform-attribute values of the audio segment's waveform attributes, (ii) computing a first distance between the determined set of waveform-attribute values and a first predefined set of waveform-attribute values representative of speech, and computing a second distance between the determined set of waveform-attribute values and a second predefined set of waveform-attribute values representative of music, (iii) using the computed first and second distances as a basis to (Continued)

classify the audio segment as primarily speech or rather primarily music, and (iv) controlling, based on the classifying, whether or not to enhance the audio segment for output.

17 Claims, 5 Drawing Sheets

(51) Int. Cl.
*G10L 21/02* (2013.01)
*G10L 25/18* (2013.01)

(56) References Cited

U.S. PATENT DOCUMENTS

| | | | |
|---|---|---|---|
| 10,580,427 B2 * | 3/2020 | Giri | G10L 21/0216 |
| 2003/0101050 A1 * | 5/2003 | Khalil | G10L 19/22 |
| | | | 704/E19.041 |
| 2004/0210436 A1 * | 10/2004 | Jiang | G10L 25/48 |
| | | | 704/E11.002 |
| 2009/0296961 A1 | 12/2009 | Hirokazu | |

FOREIGN PATENT DOCUMENTS

| | | | |
|---|---|---|---|
| WO | 2022040282 A1 | 2/2022 | |
| WO | WO-2022026481 A1 * | 2/2022 | G06F 3/162 |

OTHER PUBLICATIONS

David H. Friedman, "Pseudo-maximum-likelihood speech pitch extraction," IEEE Transactions, vol. ASSP-25, No. 3, Jun. 1977 (Year: 1977).*

Friedman, David H., "Pseudo-Maximum-Likelihood Speech Pitch Extraction," IEEE Transactions on Acoustics, Speech and Signal Processing, Jun. 1977, pp. 213-221, vol. ASSP-25, No. 3.

* cited by examiner

```
┌─────────────────────────────────────────────────┐
│  FOR EACH AUDIO SEGMENT OF A SEQUENCE OF AUDIO  │
│  SEGMENTS, DETERMINE A SET OF THE WAVEFORM-ATTRIBUTE │
│  VALUES OF THE AUDIO SEGMENT'S WAVEFORM ATTRIBUTES, │
│  WHERE AN AUDIO STREAM DEFINES THE SEQUENCE OF AUDIO │
│  SEGMENTS OVER TIME, AND WHERE EACH AUDIO SEGMENT │  502
│  DEFINES A WAVEFORM HAVING A PLURALITY OF WAVEFORM │
│  ATTRIBUTES AND, FOR EACH WAVEFORM ATTRIBUTE IN THE │
│  PLURALITY, HAVING A RESPECTIVE WAVEFORM-ATTRIBUTE │
│  VALUE AS A CHARACTERISTIC OF THE AUDIO SEGMENT │
└─────────────────────────────────────────────────┘
                         │
                         ▼
┌─────────────────────────────────────────────────┐
│  COMPUTE A FIRST DISTANCE BETWEEN THE DETERMINED SET │
│  OF WAVEFORM-ATTRIBUTE VALUES AND A FIRST PREDEFINED │
│  SET OF WAVEFORM-ATTRIBUTE VALUES REPRESENTATIVE OF │
│  SPEECH, AND COMPUTING A SECOND DISTANCE BETWEEN THE │  504
│  DETERMINED SET OF WAVEFORM-ATTRIBUTE VALUES AND A │
│  SECOND PREDEFINED SET OF WAVEFORM-ATTRIBUTE VALUES │
│              REPRESENTATIVE OF MUSIC              │
└─────────────────────────────────────────────────┘
                         │
                         ▼
┌─────────────────────────────────────────────────┐
│  USE THE COMPUTED FIRST AND SECOND DISTANCES AS A │
│  BASIS TO CLASSIFY THE AUDIO SEGMENT AS PRIMARILY │  506
│     SPEECH OR RATHER PRIMARILY MUSIC              │
└─────────────────────────────────────────────────┘
                         │
                         ▼
┌─────────────────────────────────────────────────┐
│  CONTROL, BASED ON THE CLASSIFYING, WHETHER OR NOT TO │
│       ENHANCE THE AUDIO SEGMENT FOR OUTPUT        │  508
└─────────────────────────────────────────────────┘
```

Fig. 5

AUTOMATIC CLASSIFICATION OF AUDIO CONTENT AS EITHER PRIMARILY SPEECH OR PRIMARILY NON-SPEECH, TO FACILITATE DYNAMIC APPLICATION OF DIALOGUE ENHANCEMENT

BACKGROUND

A typical media client operates to receive an analog or digital media stream representing media content such as video and/or audio content and to output the media content and/or forward the stream for presentation of the content on a user interface such as a display screen and/or an audio speaker. Examples of such clients include televisions, computer monitors, projection systems, loudspeakers, headphones, set top boxes (e.g. cable or satellite TV receivers), digital video recorders, radios, personal computers, mobile communication devices, gaming consoles, streaming media players, and the like.

By way of example, a streaming media player could be connected to or integrated with a television, computer monitor, projection system, loudspeaker, headphones, and/or one or more other content-presentation devices. And the streaming media player could cause the content-presentation devices to present a desired media-content item, such as a movie, TV show, or video game, among other possibilities. For instance, the streaming media player could cause a TV, projection system, or other connected display device to display visual content, and the streaming media player could cause a loudspeaker, headphone, or other connected audio-output device to present audio content.

SUMMARY

When a streaming media device or other computing system processes an audio stream for output, it could be useful in certain situations to modify the audio stream in order to make the playback of the audio stream more pleasant sounding to the user. In some examples, for instance, the computing system could modify the audio stream to emphasize certain characteristics of the audio stream. For instance, the computing system could enhance the audio stream by amplifying certain frequencies of the audio stream to emphasize speech or other characteristics of the audio stream. Upon output of such an enhanced audio stream, a user may be able to more clearly hear speech or other enhanced characteristics of the audio stream.

A representative audio stream could define a sequence of audio segments, and some of those segments may correspond to speech and may thus benefit from application of such enhancement, whereas other segments may correspond to music or other background noise and may not only not benefit from such an enhancement but may actually be distorted if subjected to the enhancement. Therefore, if a computing system were to apply the audio enhancement throughout the audio stream without regard to which the audio segments correspond to speech, the computing system might undesirably distort portions of the audio stream that do not correspond to speech, which may lead to poor user experience.

The present disclosure provides a technical advance to help address this issue, by dynamically and selectively enhancing certain segments of an audio stream based on a programmatic evaluation of which segments are primarily speech. This process could apply in a scenario where a computing system is processing an audio stream for ultimate output, such as in real-time as the audio stream is being played out, or perhaps when storing the audio stream for later playout, among other possibilities. In accordance with the disclosure, the computing system could programmatically evaluate each sequential segment of the audio stream, applying a classifier to determine based on one or more characteristics of audio segment whether the audio segment is primarily speech or is rather primarily music or other non-speech content. And for each segment that the computing system thereby determines is primarily speech, the computing system could subject the segment to a dialogue enhancement process. Whereas, for each segment that the computing system thereby determines is not primarily speech, the computing system could bypass or otherwise forgo that dialogue enhancement process. Further, the computing system could apply a crossfading multiplexer to seamlessly fade between outputting the audio stream without dialogue enhancement and outputting the audio stream with dialogue enhancement.

In an example implementation, to determine whether a given such audio segment is primarily speech or rather primarily music, the computing system could compare waveform attributes of the audio segment with predefined waveform attributes typical of speech and predefined waveform attributes typical of music, and the computing system could determine, based on that comparison, whether the waveform-attributes of the audio segment are closer to the predefined waveform-attributes typical of speech or rather closer to the predefined waveform attributes typical of music. For instance, the computing system could compute a first distance between (i) values representing the audio segment waveform attributes and (ii) values representing the predefined speech waveform attributes, the computing system could compute a second distance between (i) values representing the audio segment waveform attributes and (ii) values representing the predefined music waveform attributes, and the computing system could then apply a function that effectively compares those two computed distances. The output of that function could then be a classification value that represents how much closer the audio segment waveform attributes values are to the predefined speech waveform-attribute values than to the predefined music waveform-attribute values.

For each such audio segment, the computing system could then use this classification value as a basis to control whether to apply dialogue enhancement to the audio segment, such as whether to amplify certain frequencies of the audio stream that may emphasize speech or other characteristics of the audio stream for instance. The computing system could thus selectively apply this enhancement process to segments of the audio stream by applying dialogue enhancement to those audio segments that the computing system has characterized as primarily speech and bypassing or otherwise forgoing application of dialogue enhancement to audio segments that the computing system has not characterized as primarily speech (e.g., segments that the computing system has characterized as primarily music). Further, as noted above, the computing system could apply a crossfading multiplexer to smoothly transition between applying the dialogue enhancement and not applying the dialogue enhancement over the course of the audio stream.

These as well as other aspects, advantages, and alternatives will become apparent to those of ordinary skill in the art by reading the following detailed description, with reference where appropriate to the accompanying drawings. Further, it should be understood that the descriptions pro-

BRIEF DESCRIPTION OF THE DRAWINGS

FIG. 5 is a flow chart of an example method.

DETAILED DESCRIPTION

Figure 1:
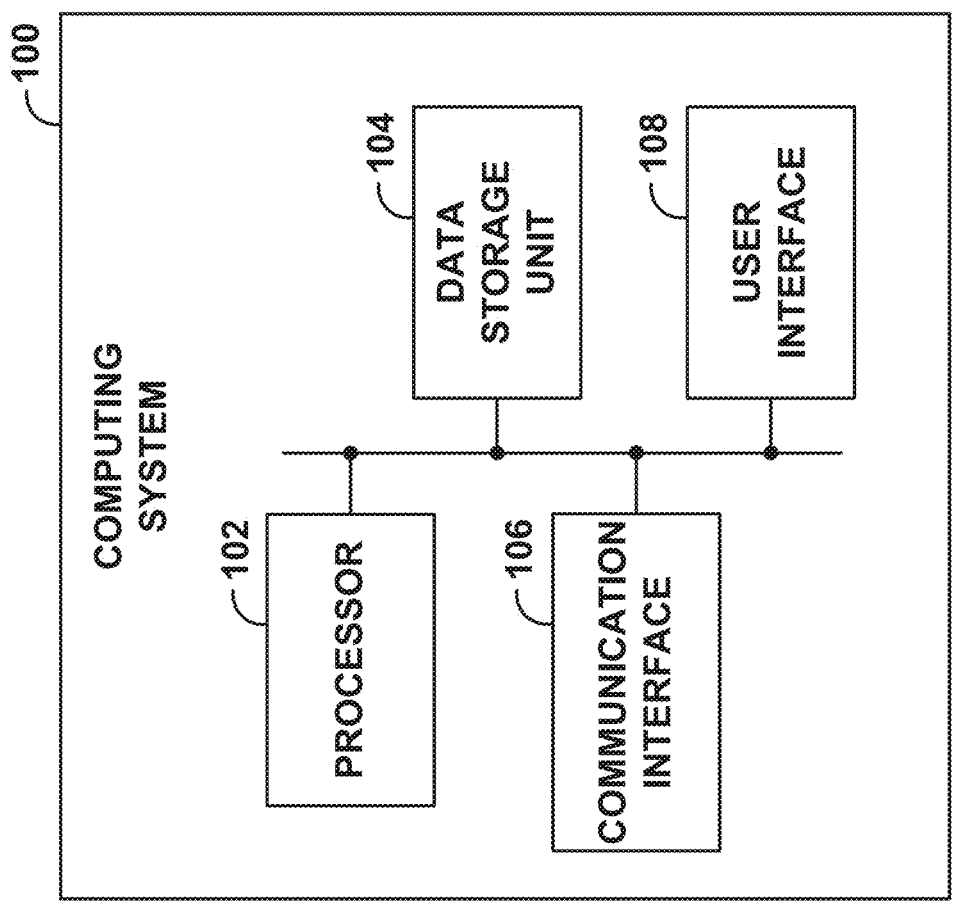
FIG. 1 is a simplified block diagram of an example computing system in which various described principles could be implemented.

The present disclosure will discuss example implementation in connection with a computing system in or associated with a media client or content presentation device such as a television, loudspeaker, or the like. It will be understood, however, that various principles disclosed could extend to apply with respect to other types of computing systems or media clients, such as set top boxes or other receivers, mobile phones, among other possibilities. Further, it will be understood that various arrangements and processes described herein could take various other forms. For instance, elements and operations could be re-ordered, distributed, replicated, combined, omitted, added, or otherwise modified. And it will be understood that functions described herein as being carried out by one or more entities could be implemented by and/or on behalf of those entities, through hardware, firmware, and/or software, such as by one or more processing units executing program instructions or the like.

Referring to the drawings, as noted above, FIG. 1 is a simplified block diagram of an example computing system 100. The computing system 100 could be configured to perform and/or could perform one or more operations, such as the operations described in this disclosure. The computing system 100 could include various components, such as a processor 102, a data-storage unit 104, a communication interface 106, and/or a user interface 108.

The processor 102 could be or include one or more general-purpose processors (e.g., microprocessors) and/or one or more special-purpose processors (e.g., digital signal processors). The processor 102 could execute program instructions included in the data-storage unit 104 as described below.

The data-storage unit 104 could be or include one or more volatile, non-volatile, removable, and/or non-removable storage components, such as magnetic, optical, and/or flash storage, and/or could be integrated in whole or in part with the processor 102. Further, the data-storage unit 104 could be or include a non-transitory computer-readable storage medium, having stored thereon program instructions (e.g., compiled or non-compiled program logic and/or machine code) that, upon execution by the processor 102, cause the computing system 100 and/or another computing system to perform one or more operations, such as the operations described in this disclosure. These program instructions could define, and/or could be part of, a discrete software application.

In some instances, the computing system 100 could execute program instructions in response to receiving an input, such as an input received via the communication interface 106 and/or the user interface 108. The data-storage unit 104 could also store other data, such as any of the data described in this disclosure.

The communication interface 106 could allow the computing system 100 to connect with and/or communicate with another entity according to one or more protocols. Therefore, the computing system 100 could transmit data to, and/or receive data from, one or more other entities according to one or more protocols. In one example, the communication interface 106 could be or include a wired interface, such as an Ethernet interface or a High-Definition Multimedia Interface (HDMI). In another example, the communication interface 106 could be or include a wireless interface, such as a cellular or WI-FI interface.

The user interface 108 could allow for interaction between the computing system 100 and a user of the computing system 100. As such, the user interface 108 could be or include an input component such as a keyboard, a mouse, a remote controller, a microphone, and/or a touch-sensitive panel. The user interface 108 could also be or include an output component such as a display device (which, for example, could be combined with a touch-sensitive panel) and/or a sound speaker.

The computing system 100 could also include one or more connection mechanisms that connect various components within the computing system 100. For example, the computing system 100 could include the connection mechanisms represented by lines that connect components of the computing system 100, as shown in FIG. 1.

The computing system 100 could include one or more of the above-described components and could be configured or arranged in various ways. For example, the computing system 100 could be configured as a server and/or a client (or perhaps a cluster of servers and/or a cluster of clients) operating in one or more server-client type arrangements, for instance.

In some cases, the computing system 100 could take the form of a specific type of computing system. For instance, the computing system 100 could take the form of a desktop computer, a laptop, a tablet, a mobile phone, a television set, a set-top box, a streaming media player, a television set with an integrated set-top box or streaming media player, a media dongle, or a television set with a media dongle, streaming media player, or other device connected to it, among other possibilities.

The computing system 100 and/or components thereof could be configured to perform and/or could perform one or more operations. Examples of these operations and related features will now be described.

Figure 2:
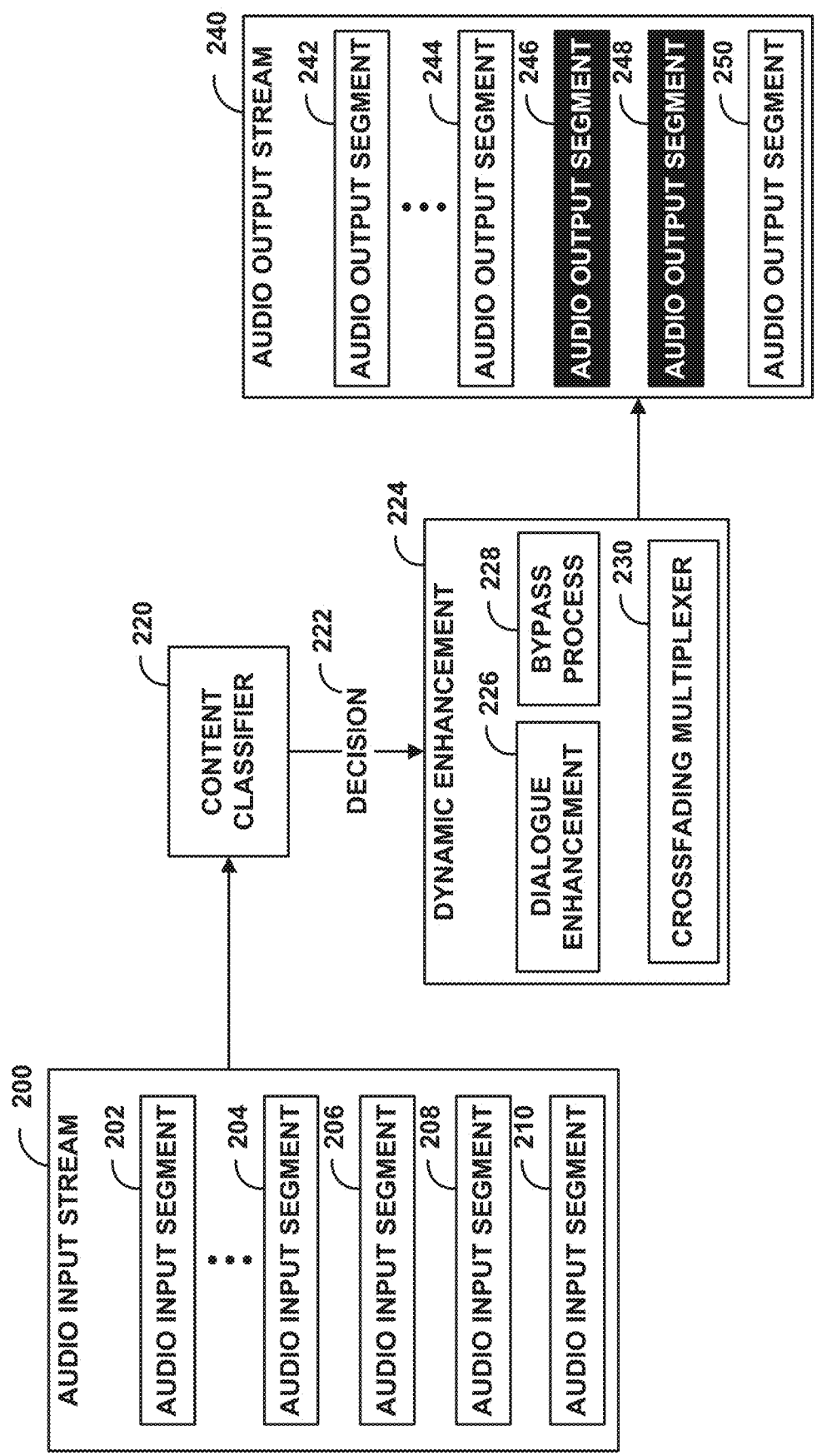
FIG. 2 is a simplified block diagram illustrating components of an example dynamic dialogue enhancement process.

As noted above, a computing system operating in accordance with the present disclosure could dynamically and selectively enhance certain segments of an audio stream based on a programmatic evaluation of which segments are primarily speech. FIG. 2 is a simplified block diagram illustrating a process flow related to this method that the computing system could implement.

As shown in FIG. 2, the computing system could carry out this process of dynamically and selectively enhancing certain segments of an audio input stream 200. While the computing system processes the audio input stream 200 for output, the computing system could sequentially portion the audio input stream 200 into multiple audio input segments over time, including audio input segments 202, 204, 206, 208, and 210. In some examples, the audio input stream 200 could be an ongoing stream of content, consisting of various sounds, e.g., speech, music, background noise, among others. When the audio input stream 200 is split into various audio input segments, the computing system could determine a characterization of each audio input segment as speech, music, background noise, and/or other sounds and could use this characterization as a basis to dynamically control whether to apply dialogue enhancement to the segment.

As mentioned above, the present disclosure largely focuses by way of example on determining whether a given audio segment can be characterized as primarily speech or rather primarily music. Speech and music may each have distinct characteristics, and the computing system could use these distinct characteristics as a basis to determine whether a given audio segment is primarily speech or primarily music.

In accordance with the present disclosure, for each sequential audio input segment of audio input stream 200, the computing system could compute these characteristics at a content classifier stage 220. Specifically, applying the content classifier 220 to the audio input segment, the computing system could compute various waveform-attribute values corresponding to various waveform attributes, and the computing system could compare these waveform-attribute values to both a predefined set of waveform-attribute values corresponding to speech and another predefined set of waveform-attribute values corresponding to music. Based on these comparisons, the computing system could then make a decision 222 of whether the audio input segment is primarily music or rather primarily speech.

For each such audio input segment, the computing system could then use decision 222 as a basis to select an operation in a dynamic enhancement stage 224, namely, whether to apply dialogue enhancement 226 or rather to bypass the dialogue enhancement by instead effectively applying a bypass process 228. Specifically, if the decision 222 is that the audio input segment is primarily speech, then the computing system could apply dialogue enhancement 226 to the audio input segment to establish a dynamically enhanced version of the audio input segment. Whereas, if the decision 222 is that the audio input segment is primarily music, then the computing system could instead forgo application of the dialogue enhancement 226 by applying the bypass process 228 to audio input segment.

As the computing system processes the audio input segments of audio input stream 200, the computing system could decide to apply dialogue enhancement 226 to certain audio input segments and to bypass application of dialogue enhancement to other audio input segments. To help smoothly transition between applying dialogue enhancement and not applying dialogue enhancement, the computing system could further apply a crossfading multiplexer 230 to crossfade between applying the dialogue enhancement and not applying the dialogue enhancement.

As the computing system processes each such audio input segment at dynamic enhancement stage 224, the computing system could output the result as a respective audio output segment, so as to provide an audio stream output 240 having a sequence of audio output segments that correspond with the sequence of audio input segments of audio input stream 200. Thus, the audio output stream could include or define audio output segments 242, 244, 246, 248, and 250 corresponding respectively with audio input segments 202, 204, 206, 208, and 210.

For example, while processing audio input stream 200, the computing system may apply bypass process 228 to audio input segment 204 in response to determining that audio input segment 204 is primarily music, and the computing system may apply dialogue enhancement 226 to subsequent audio input segment 206 in response to determining that audio input segment 206 is primarily speech. As the computing system thus transitions from bypassing dialogue enhancement of audio input segment 204 to applying dialogue enhancement to audio input segment 206, the computing system could apply crossfading multiplexer 230 to help smoothly transition from the audio stream with dialogue enhancement to the audio stream with dialogue enhancement.

The computing system could carry out this process of dynamically enhancing the dialogue of an audio stream at various points of the audio stream playout, including before presentation of the audio stream or during presentation of the audio stream. For example, the computing system could carry out this dynamic audio enhancement process before the presentation of the audio stream, and the computing system could store the processed audio segments for playout at a later time. Additionally or alternatively, the computing system could carry out this dynamic audio enhancement process during presentation of the audio stream, such that the computing system presents the audio segments for playout immediately after the audio segments have been processed.

Further, the computing system could apply this dynamic audio enhancement process to one or more channels in an audio stream. In some examples, the computing system could contain two or more media presentation devices (e.g., two or more speakers), and an audio stream could include various waveforms to be output over various channels, each channel to be output on one of the media presentation devices. The computing system could thus apply this dynamic audio enhancement process to the waveform of each channel to dynamically enhance the dialogue in each audio segment output by the two or more media presentation devices.

As noted above, the process of the computing system classifying a given audio segment as being either primarily speech or primarily music could involve the computing system determining waveform-attribute values of the audio segment and comparing these waveform-attribute values with a predefined set of waveform-attribute values typical of speech and a predefined set of waveform-attribute values typical of music.

Figure 3:
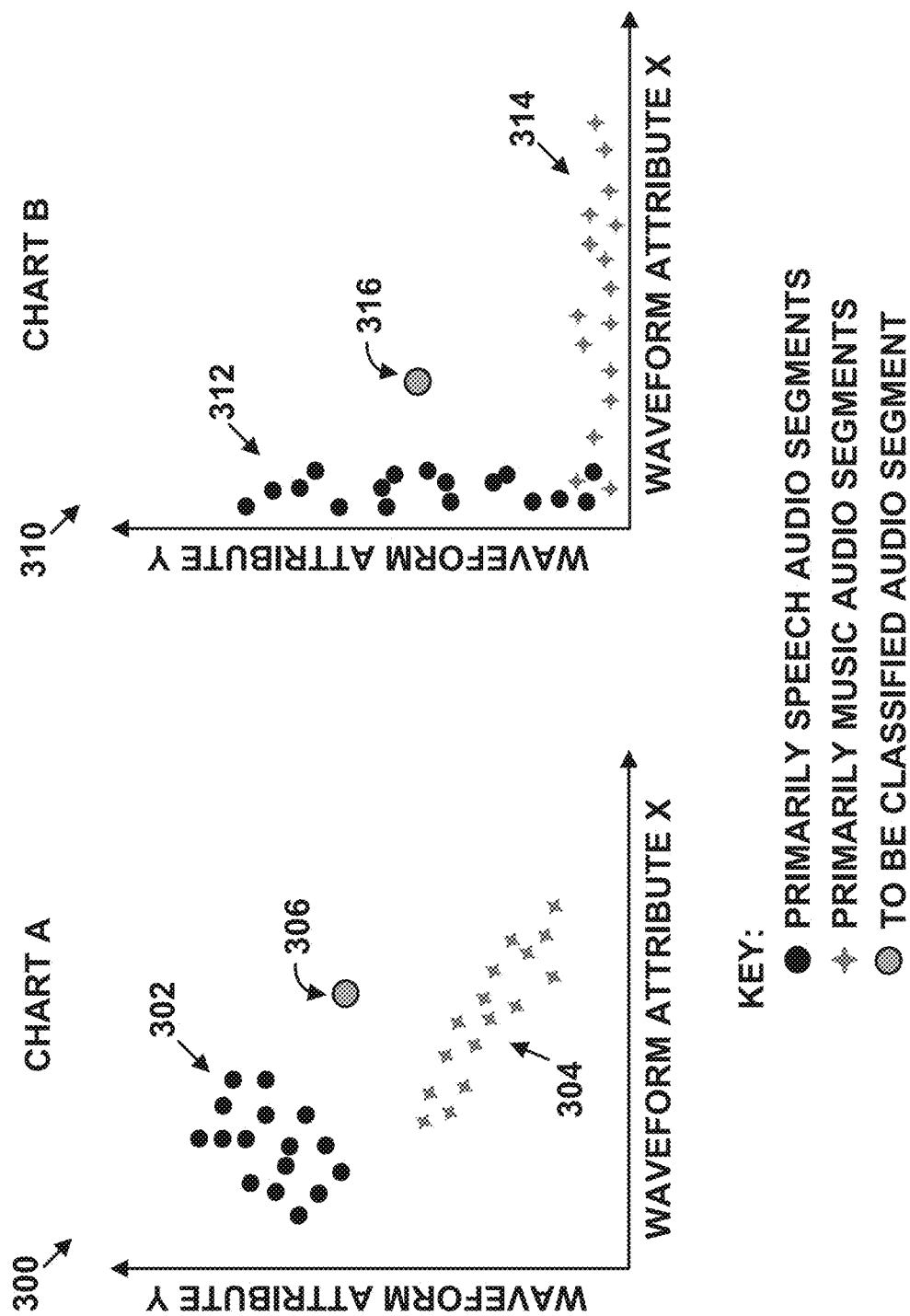
FIG. 3 are example plots representing waveform-attribute values.

FIG. 3 depicts example plots of waveform-attribute values that the computing system might determine for an example audio segment compared with examples of predefined waveform-attribute values.

For a given audio segment, the computing system could take into account various waveform attributes and could determine waveform-attribute values in various ways.

In some examples, determining the waveform-attribute values of an audio segment could involve calculating a Fourier Transform of the audio segment to determine a frequency-domain representation. Transforming the audio segment from time-domain to frequency-domain could be useful in characterizing an audio segment as speech or music, because many characteristic differences between speech and music are more related to the frequencies and distribution of frequencies of sound waveforms than to the amplitude or variance in amplitude in time of the sound waveforms.

However, calculating the Fourier Transform of an audio segment could require extensive amounts of computer resources (e.g., memory, processor power, etc.) Therefore, in some examples, the computing system could calculate the waveform-attribute values of the audio segment without calculating the Fourier Transform. Instead, the computing system could calculate the frequency domain representation or a similar representation of the audio segment using an alternative method, and the computing system could use the resulting representation of the audio segment in determining the waveform-attribute values.

For instance, rather than computing the Fourier Transform of the audio segment, the computing system could apply a pseudo-maximum-likelihood method to the audio segment to determine certain frequency-domain characteristics. Specifically, the computing system could assume that the waveform defined by the audio segment is periodic or nearly periodic, and the computing system could then apply the pseudo-maximum-likelihood method to determine pitch frequencies of this periodic or nearly-periodic waveform by determining period values that maximize the energy of a sum of periods of the waveform, as weighted by a time window. In particular, the computing system could calculate:

$$R_1(t_o) = \frac{I_o(t_o) - I_1(t_o)}{E - I_1(t_o)}$$

where $$I_1(t_o) = \int_0^{t_o} \frac{\sum_h s^2(t + ht_o)w^2(t + ht_o)}{\sum_h w(t + ht_o)} dt = \int_0^T s^2(t)w(t) \frac{w(t)}{\sum_h w(t + ht_o)} dt,$$

$$I_o(t_o) = \int_0^{t_o} \frac{\left[\sum_h s(t + ht_o)w(t + ht_o)\right]^2}{\sum_h w(t + ht_o)} dt,$$

$$E = \int_0^T s^2(t)w(t)dt,$$

s(t) is the audio segment having an estimated period T, $t_o$ is greater than or equal to zero and less than T, w(t) is a weighting function, and h=0, 1, 2 ... The computing system could apply the pseudo-maximum-likelihood method as outlined in D. Friedman, "Pseudo-Maximum-Likelihood Speech Pitch Extraction," *IEEE Trans. Acoust., Speech, Signal Processing*, vol. ASSP-25, pp. 213-221, June 1977.

After the computing system calculates the value of $R_1(t_0)$ for various to values, the computing system could determine that the audio segment has pitch frequencies at the values of $t_0$ with higher $R_1$ values compared to the neighboring $t_0$ and $R_1$ values. And the computing system could use the resulting pitch frequencies to facilitate determining one or more waveform-attribute values.

In some examples, the computing system could compute waveform-attribute values for each audio segment, where the waveform attributes include the pseudo-maximum likelihood threshold, the pitch-frequency distribution minimum peak level, and the variance in linear-prediction coefficients.

As to the pseudo-maximum likelihood ratio, for instance, the computing system could apply the pseudo-maximum likelihood method described above to determine the pitch frequencies of the periodic or nearly-periodic waveform defined by the audio segment. As discussed above, the computing system could thereby obtain pitch frequencies at various values of $t_0$, and each value of $t_0$ could be associated with a value of $R_1$. Based on the peaks (e.g., to values with higher $R_1$ values compared to neighboring $t_0$ values), the computing system could then determine a normalized ratio of high peaks verses low peaks. Further, the computing system could divide the audio segment into sequential frames and apply the pseudo-maximum likelihood method to each of the frames. The computing system could then determine (i) a high peak count by determining the number of frames where the highest peak exceeds a high threshold value and (ii) a low peak count by determining the number of frames where the lowest peak exceeds a low threshold value. The computing system could then calculate the value of the pseudo-maximum likelihood threshold ratio by dividing the high peak count by the low peak count. When the computing system calculates this measure for multiple audio segments of speech and music, the distribution of the pseudo-maximum likelihood threshold values of speech could be narrower than that of music, which could be attributed to the narrower range of frequencies present in human voice.

As to pitch-frequency distribution minimum peak level, on the other hand, the computing system could divide the audio segment into multiple consecutive audio frames, and for each audio frame the computing system could calculate the pitch-frequencies of the audio segment through using the pseudo-maximum likelihood method as disclosed above. The computing system could then aggregate the pitch-frequencies calculated from the consecutive audio frames into a frequency distribution of the calculated pitch-frequencies. And based on this frequency distribution, computing system could determine the maximum level of the frequency distribution to obtain the pitch-frequency distribution maximum peak level. Audio segments that are primarily music could contain pitch frequencies that are constant over consecutive frames, resulting in a higher narrower peak (e.g., a higher maximum), while the varying pitch frequencies of speech could result in broader and lower peaks.

Further, as to variance in linear-prediction coefficients, the computing system could compute the linear-prediction coefficients of a particular audio segment by minimizing prediction error as measured by least squares regression. Specifically, the computing system could down-sample the audio segment and fit the resulting time-domain samples with an autoregressive model that predicts future values based on past values. The autoregressive model could have an order of p and could be in the form of $x'(i)=c_1x(i-1)+c_2x(i-2)+c_3x(i-3)+c_px(i-p)$. The computing system could then calculate the variance of the coefficients (e.g., calculate the variance between $c_1, c_2, c_3 \ldots c_p$) to obtain the value of the variance in the linear prediction coefficients. This waveform attribute could facilitate differentiating between the syllables of speech and the rhythm of music, and/or between the pitch of speech and the tonality of music, among other characteristics, as variances in linear prediction coefficients could be higher for speech than for music.

For each such audio segment, the computing system could determine one or more of these waveform-attribute values and could then determine whether the audio segment is primarily music or primarily speech, based on a comparison of the determined waveform-attribute value(s) with predefined sets of waveform-attribute values corresponding respectively with speech and to music. To facilitate this, the computing system could determine in advance or otherwise have advanced access to a first predefined set of waveform-attribute values that correspond with primarily speech audio and a second predefined set of waveform-attribute values that correspond with primarily music audio. The computing system could then compare the determined waveform-attribute values of the audio segment respectively with each of these predefined sets of waveform-attribute values.

Applying this process with respect to multiple waveform attributes such as those noted above, each predefined set of waveform-attribute values could be a single data point consisting of values of those multiple waveform attributes. For instance, with waveform attributes A, B, and C, the predefined set of waveform-attribute values deemed to correspond with primarily-speech audio could be a single data point $\{V_{A\text{-}SPEECH}, V_{B\text{-}SPEECH}, V_{C\text{-}SPEECH}\}$ of values of waveform attributes A, B, and C deemed to correspond with primarily-speech audio, and the predefined set of waveform-attribute values deemed to correspond with primarily-music audio could be another single data point $\{V_{A\text{-}MUSIC}, V_{B\text{-}MUSIC}, V_{C\text{-}MUSIC}\}$ of values of waveform attributes A, B, and C deemed to correspond with primarily-music audio.

When evaluating an audio segment at issue, the computing system could then establish a data point $\{V_{A\text{-}SEGMENT}, V_{B\text{-}SEGMENT}, V_{C\text{-}SEGMENT}\}$ of values of the waveform attributes of that audio segment, and the computing system could compare that established data point respectively (i) with the single data point of predefined waveform-attribute values corresponding with primarily-speech audio and (ii) with the single data point of predefined waveform-attribute values corresponding with primarily-music audio.

Alternatively, each predefined set of waveform-attribute values could be multiple data points each consisting of values of the multiple waveform attributes. And in that case, to facilitate a comparison with waveform attributes values of a given audio segment, the computing system could statistically combine the multiple data points to establish a simplified representation such as a single data point or a single distribution per waveform attribute. The computing system could then compare the set of waveform-attribute values of the given audio segment with that simplified representation of the multiple data points defining the predefined set of waveform-attribute values.

In particular, the computing system could use the data points consisting of waveform-attribute values of primarily-speech audio to establish a simplified representation of waveform-attribute values corresponding with primarily-speech audio, and the computing system could compare the set of waveform-attribute values of the given audio segment with that simplified representation of waveform-attribute values corresponding with primarily-speech audio. And the computing system could likewise use the data points consisting of waveform-attribute values of primarily-music audio to establish a simplified representation of waveform-attribute values corresponding with primarily-music audio, and the computing system could then compare the set of waveform-attribute values of the given audio segment with that simplified representation of waveform-attribute values corresponding with primarily-music audio.

As an illustration of this process, plot 300 of FIG. 3 shows a first predefined set of data points 302 each consisting of waveform-attribute values associated with primarily-speech audio segments, a second predefined set of data points 304 each consisting of waveform-attribute values associated with primarily-music audio segments, and a data point 306 consisting of a determined set of waveform-attribute values of an example audio input segment at issue. In the illustration, each data point consists of a value of waveform attribute X and a value of waveform attribute Y. However, in practice, each data point could consist of any number of waveform-attribute values, perhaps values of the three waveform attributes mentioned above (e.g., pseudo-maximum likelihood threshold, pitch-frequency distribution minimum peak level, and variance in linear-prediction coefficients), among other possibilities.

In an example implementation, the computing system could itself establish data points 302, 304 based on evaluation of audio segments known or determined to be primarily speech or primarily music. For instance, to establish the data points 302 consisting of waveform-attribute values typical of speech, the computing system could determine, for each of various audio segments deemed to be primarily speech, values of the representative waveform attributes of the audio segment. And to establish the data points 304 consisting of waveform-attribute values typical of music, the computing system could determine, for each of various audio segments deemed to be primarily music, values of the waveform attributes of the audio segment.

Further, to facilitate comparison of data point 306 with data points 302 and with data points 304, the computing system could simplify each of sets 302, 304. For instance, for each set of data points, the computing system could establish a representative set of distributions of the underlying waveform-attribute values. For example, the computing system could establish for set 302 a representative distribution of the values of waveform attribute X in the set and a representative distribution of the values of waveform attribute Y in the set, and the computing system could then (i) compare the value of waveform attribute X of data point 306 with the representative distribution of the values of waveform attribute X in set 302 and (ii) compare the value of waveform-attribute value Y of data point 306 with the representative distribution of the values of waveform attribute Y in set 302. And the computing system could likewise establish for set 304 a representative distribution of the values of waveform attribute X in the set and a representative distribution of the values of waveform attribute Y in the set, and the computing system could then (i) compare the value of waveform attribute X of data point 306 with the representative distribution of the values of waveform attribute X in set 304 and (ii) compare the value of waveform attribute Y of data point 306 with the representative distribution of the values of waveform attribute Y in set 304.

One issue that could arise in carrying out this example process is that the distribution of predefined values of a given waveform attribute may be non-Gaussian, perhaps skewed in a particular direction (e.g., positively or negatively). To address this issue, the computing system could transform (e.g., normalize) the waveform-attribute values in a manner that helps provide a more Gaussian distribution without significant skew, and the computing system could similarly transform the waveform-attribute values of each audio segment at issue.

In an example implementation, transforming the waveform-attribute values could involve applying a mathematical function, such as a logarithm function or a tangent function to each waveform-attribute value. For instance, as to linear-prediction coefficients or pitch-frequency distribution maximum levels, the computing system could apply a logarithm function to each waveform-attribute value. And as to pseudo-maximum likelihood threshold ratio, the computing system could apply a tangent function to each waveform-attribute value. These or other functions may help to make each distribution of predefined values of a given waveform attribute more closely resemble a Gaussian distribution, which may help to facilitate a comparison of that distribution with the value of that waveform attribute of each audio segment at issue.

For various audio segments that are deemed to be primarily speech and various audio segments that are deemed to be primarily music, and the computing system could calculate these transformed values for a various audio segments to respectively obtain first predefined set of waveform-attribute values 302 and second predefined set of waveform-attribute values 304. The computing system could store these predefined sets of waveform-attribute values in data storage or could transmit these predefined sets of waveform-attribute values to another computing system for storage.

Thereafter, the computing system could receive an audio segment to classify as either music or speech. The computing system could calculate the transformed waveform-attribute values of that audio segment as data point or set 306 using the process described above, and the computing system could compare that set of transformed waveform-attribute values 306 with the first predefined set of waveform-attribute values 302 corresponding with primarily speech audio and with the second predefined set of waveform-attribute values 304 corresponding with primarily music audio.

In an example implementation, to classify an audio segment of the audio stream, the computing system could compute the transformed values of the waveform attributes of the audio segment and the Mahalanobis distances between the transformed values and the centroids of each of the clusters formed by the first predefined set of waveform-attribute values 302 and by the second predefined set of waveform-attribute values 304. Specifically, the computing system could calculate the Mahalanobis distance between the transformed waveform attribute values of the audio segments and each of the clusters formed by the each of the predefined set of waveform-attribute values by solving for $d_1$ in the following equation:

$$d_1^2(x) = (x - m_1)' S_1^{-1} (x - m_1)$$

where x represents the waveform-attribute values of the audio segment, $m_1$ represents the centroid of the cluster formed by one of the predefined set of waveform-attribute values, where x and $m_1$ are column vectors, ' represents a transpose operation from column vectors into row vectors, and where $$S_1 = \frac{1}{n_1} \sum_{i=1 \ldots n_1} (x_{1i} - m_1)'$$

The computing system could calculate $d_1$ for each of the predefined set of waveform-attribute values. Using these two computed distances, the computing system could then classify the audio sample as either primarily music or primarily speech based on the transformed waveform-feature values being closest (e.g., having the smallest distance) to a cluster that indicates music or a cluster that indicates speech.

For example, the computing system could determine a classification value that quantifies or represents a comparison between (i) the distance of the audio segment's waveform-attribute values from the waveform-attribute values of primarily-speech audio segments and (i) the distance of the audio segment's waveform-attribute values from the waveform-attribute values of primarily-music audio segments. This classification value could be between zero and one, and the computing system could then compare the classification value to a predefined threshold in order determine whether the audio segment is primarily music or primarily speech.

Specifically, the classification value could be calculated using a formula such as:

$$\text{classification value} = 0.5(1 + \frac{d_0^2 - d_1^2}{d_0^2 + d_1^2})$$

where $d_0$ represents a Mahalanobis distance from the waveform-attribute values 306 and the centroid of the cluster formed by the first predefined set of waveform-attribute values 302, and $d_1$ represents a Mahalanobis distance from the waveform-attribute values 306 and the centroid of the cluster formed by the second predefined set of waveform-attribute values 304. This classification value could go to zero as $d_0 >> d_1$ when the audio segment is primarily music. And the classification value could go to one as $d_0 << d_1$ when the audio segment is primarily speech.

Carrying out this process with three or more waveform attributes could be somewhat complex. With the three example waveform attributes noted above, for instance, the process would involve comparing values of those three waveform attributes for each audio segment at issue (i) with values of those three waveform attributes for primarily-speech audio and (ii) with values of those three waveform attributes for primarily-music audio. To help simplify this process, the computing system could transform each three-dimensional data point into a two-dimensional data point. For instance, for each three-dimensional data point, the computing system could combine together two of the waveform-attribute values into a composite value, optimally in a manner that helps to distinguish speech waveform-attribute values from music waveform-attribute values. The computing system could thus convert each set of the three waveform-attribute values into a set of just two values: (i) the composite value that is a combination of two of the waveform-attribute values and (ii) the third waveform-attribute value.

To facilitate establishing a composite value of two waveform attributes in a manner that also helps to distinguish primarily-speech audio from primarily-music audio, the computing system could evaluate numerous sample pairs of those waveform-attribute values and could establish an equation that produces, based on any given such pair of the waveform-attribute values, a composite value that predicts whether the pair more likely represents primarily-speech audio or more likely represents primarily-music audio.

For instance, to facilitate establishing a composite value as to two waveform attributes A and B, the computing system could plot each pair of waveform-attribute values as a data point in a Cartesian coordinate system with values of attribute A along one axis and values of attribute B along the other axis. The computing system could then evaluate the plot of these data points and determine that the data points for primarily-speech audio are clustered in an ellipsoid shape and that the data points for primarily-music audio are scattered around that ellipsoid. Given this, the computing system could then model that ellipsoid as an equation keyed to the value of attribute A and the value of attribute B, with the equation producing a composite value that is larger for a given pair of those attribute values that is closer to the center of the ellipsoid and smaller for a given pair of those attribute values that is farther away from the center of the ellipsoid.

Given multiple data points each consisting of the three waveform-attribute values noted above, for instance, the computing system may carry out this process to simplify each data point by converting the values of pseudo-maximum likelihood threshold ratio and pitch frequency distribution maximum level of each data point into a composite value. Namely, given data points for audio samples known to be primarily-speech audio or known to be primarily-music audio, the computing system could plot the data points in a Cartesian coordinate system with values of pseudo-maximum likelihood threshold ratio along one axis and values of pitch frequency distribution maximum level along the other axis and could then model a cluster of points that are for the primarily-speech samples, to establish an equation as noted above.

The computing system could then apply this equation to each data point for the audio samples known to be primarily-speech audio or primarily-music audio in order to establish for each data point a composite value in place of the data point's values of pseudo-maximum likelihood threshold ratio and pitch frequency distribution maximum level. And the computing system could thereby convert each three-dimensional data point into a two-dimensional data point consisting of that composite value and the data point's value of variance in linear-prediction coefficients. Further, the computing system could likewise convert a three-dimensional data point for an audio segment at issue into a two-dimensional data point, to facilitate then performing a comparison with the two-dimensional data points for audio known to be primarily speech or primarily audio.

In a likely implementation, the first predefined set of waveform-attribute values 312 and the second predefined set of waveform-attribute values 314 could define respective point clusters as shown in plot 310 of FIG. 3. The computing system could thus use these clusters as a basis characterize audio segments as being either primarily speech or primarily music.

With this arrangement, in an example implementation, the computing system could calculate an angle that represents the how close an audio segment's waveform-attribute values 316 are to the first predefined set of waveform-attribute values 312 and how close the audio segment's waveform-attribute values 316 are to the second predefined set of waveform-attribute values 314. The computing system could base the calculation of this angle on the separation of the predefined sets of waveform-attribute values in plot 310. For example, plot 310 could have axes corresponding to values of the variance in linear-prediction coefficients and the composite value, and plot 310 could have the first predefined set of waveform-attribute values 312 and the second predefined set of waveform-attribute values 314 as data. In this example plot 310, the first predefined set of waveform-attributes 312 are scattered along one axis and second predefined set of waveform-attribute values 314 are scattered along another axis. Therefore, calculating the angle that represents the audio segment's proximity to the first and second predefined sets of waveform-attribute values 312, 314 could involve normalizing an angle calculation such that a 90 degree angle results in a value of one (indicating speech) and an angle of zero degrees results in a value of zero (indicating music). And normalizing the angle to be between one and zero could involve applying an arctangent of the composite waveform attribute divided by the value of the linear-prediction coefficient variance.

In turn, the computing system could compare the normalized angle with a threshold low value and/or a threshold high value to characterize the audio content as being primarily music or speech. For instance, if the computing system determines that the normalized angle is below a threshold low value, then the computing system could characterize the audio content as being primarily music. And if the computing system determines that the normalized angle is above a threshold high value, then the computing system could characterize the audio content as primarily speech.

In an example dynamic enhancement process, the computing system could repeat the process illustrated by plot 300, the process illustrated by plot 310, or other processes of determining whether an audio segment is speech or music for various audio segments of an audio segment.

Figure 4:
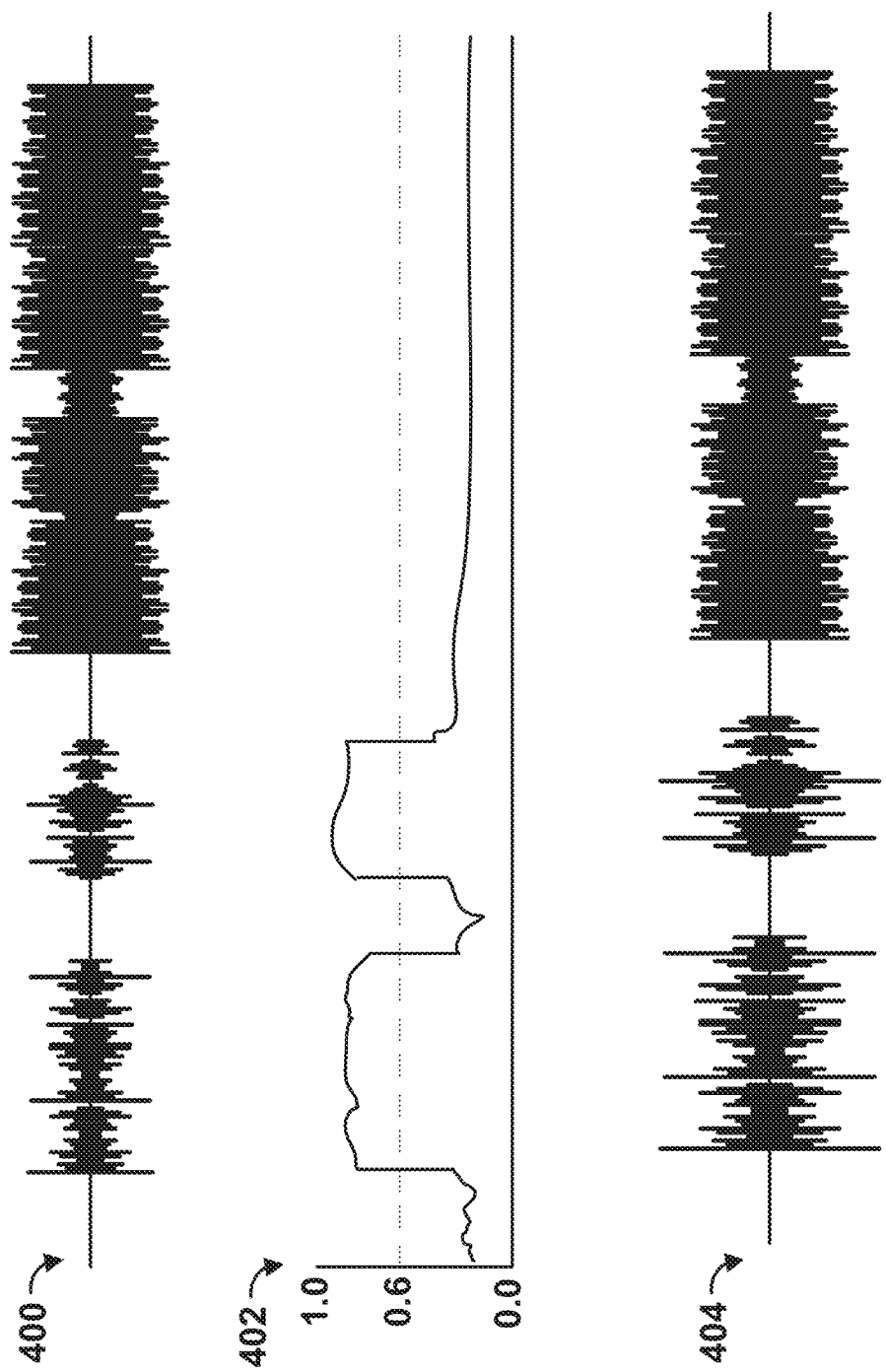
FIG. 4 depicts example audio segments.

FIG. 4 depicts an example audio stream to which the dynamic enhancement process described herein could be applied. FIG. 4 includes audio stream 400, classification plot 402, and a partially enhanced audio stream 404. The computing system could receive audio segments of audio stream 400, and in applying the classifier, the computing system could determine classification values for each of the audio streams, as described above and as shown in classification plot 402.

As noted above, to determine whether each audio segment is primarily speech or primarily music, the computing system could determine a classification value and apply a threshold value. In some examples, the classification value could be between zero and one, where a classification value of zero represents proximity of the audio segment to the audio segments that are deemed to be music and a classification value of one represents proximity of the audio segment to audio segments that are deemed to be speech. Consequently, the threshold value could also be between zero and one, with a lower threshold value likely to result in more audio segments of the audio stream being classified as primarily speech and a higher threshold value likely to result in more segments of the audio segments of the audio stream being classified as primarily music.

As shown by classification plot 402, the computing system could apply a threshold value of 0.6 to each of the determined classification values as a basis to determine whether each audio segment is primarily speech or primarily music. Accordingly, the computing system could classify audio segments that the computing system determined to have a classification value of less than 0.6 as primarily music. And the computing system could classify the audio segments that the computing system determined to have classification values of above 0.6 as primarily speech.

Note that this audio classification process may not may not be correct in every instance. Applying the presently disclosed principles, however, the computing system could reasonably predict whether a given audio segment is primarily speech or is rather primarily music (or other non-speech), which could facilitate dynamically applying dialogue enhancement as discussed above.

After classifying each audio segment of the audio stream as being either primarily speech or primarily music, the computing system could thus determine whether to apply dialogue enhancement, as noted above. And as shown in partially enhanced audio stream 404 in FIG. 4, the computing system could therefore apply dialogue enhancement to segments of the audio stream that the computing system classifies as primarily speech and bypass application of dialogue enhancement to audio segments that the computing system classifies as primarily music or otherwise as not primarily speech.

This dialogue enhancement process could take various forms. For example, the dialogue enhancement process could involve applying a bandpass filter to an audio segment to amplify the sounds of the frequencies that are associated with human voice and to reduce the sounds of other frequencies. Additionally or alternatively, in a scenario where the audio segment includes a plurality of channels and where an audio playback system includes a 5.1 surround sound configuration with three front speakers, two back speakers, and a low frequency effects channel (e.g., for bass sounds), the computing system could combine these six channels into three channels, isolating sounds that could be associated with the center channel—the channel typically associated with outputting speech. Further, the computing system could apply a bandpass gain to the center channel to help amplify the frequencies associated with speech. Other methods that may help to enhance the spoken dialogue in the audio content are also possible.

One issue that could arise in switching between carrying out the dialogue enhancement process and bypassing the dialogue enhancement process is that the processes may take different amounts of time, resulting in a disconnect in audio output. For example, applying bandpass filters and bandpass gains could involve convolving the audio content with the bandpass filter, a process that could involve many calculations, causing delays in the output of the signal. Whereas, bypassing the dialogue enhancement process would involve fewer, if any, calculations.

Therefore, to address this issue, if the computing system determines that the audio segment is associated with music and that the dialogue enhancement should not be applied, then the computing system could instead bypass the dialogue enhancement process by delaying output of the audio segment for a predetermined length of time. Specifically, the computing system could determine that applying dialogue enhancement takes a predetermined length of time. And in view of this predetermined length of time, the computing system could determine that bypassing the dialogue enhancement process should involve delaying the audio segment by that predetermined length of time.

In turn, for two adjacent audio segments in the audio stream where the dialogue enhancement is applied for one of the two adjacent audio segments and not applied for the other audio segment, the computing system may apply a crossfading multiplexer to smoothly transition between applying the dialogue enhancement process and bypassing the dialogue enhancement process. For example, when transitioning from applying the dialogue enhancement to one audio segment and not applying the dialogue enhancement for a subsequent audio segment (e.g., when the computing system classifies the audio segment as primarily speech and the subsequent audio segment as primarily music), the computing system could gradually turn off the dialogue enhancement near the end of the audio segment and/or the beginning of the subsequent segment. And when transitioning from not applying the dialogue enhancement to one audio segment and applying the dialogue enhancement for a subsequent audio segment (e.g., when the computing system classifies the audio segment as primarily music and the subsequent audio segment as primarily speech), the computing system could gradually turn on the dialogue enhancement near the end of the audio segment and/or the beginning of the subsequent audio segment.

In an example implementation, this process of intelligently enhancing certain segments of the audio stream that correspond to speech could be done in response to a user setting on a content-presentation device. For example, a user could select, through a remote connected to a TV and from a plurality of dialogue enhancement options (e.g., "ON," "OFF," or "AUTO"), that the dialogue enhancement is to be automatically done (e.g., per the present process), rather than having the dialogue enhancement be continuously on or off.

Further, rather than or in addition to applying this process of intelligently enhancing certain audio segments of the audio stream that correspond to speech, the computing system could apply this process to other characterizations of audio segments of the audio stream. For example, in certain situations, it could be advantageous to clarify certain audio segments of the audio stream that correspond to music rather than background noise. To address that, the computing system could apply a similar process of determining waveform-attribute values for various audio segments deemed to be music and for various audio segments deemed to be background noise and of comparing these determined waveform-attribute values to an audio segment of the audio stream. The computing system could then apply audio enhancement to audio segments determined to be primarily music, and the computing system could bypass applying audio enhancement for audio segments determined to be not primarily music (e.g., audio segments determined to be primarily background noise).

In some examples, the computing system could apply the dynamic enhancement process described herein in advance of playout of the audio content and could store the resulting audio content, with dynamically enhanced audio segments in data storage on the computing system or on a server connected to the computing system. When the computing system receives an indication to present an audio stream, the computing system may first verify if the computing system or other system stores the enhanced audio stream. If the computing system or other system stores the enhanced audio stream, then the computing system may retrieve the enhanced audio stream rather than undergoing the process to enhance the audio stream during playout. This process of enhancing the audio stream in advance may be particularly useful to reduce excess computations for audio streams that are presented more frequently, e.g., an audio segment of a show that is exceptionally popular among viewers.

FIG. 5 is a flow chart of a method that can be carried out in accordance with the present disclosure. As shown in FIG. 5, at block 502, the method includes, for each audio segment of a sequence of audio segments, determining a set of the waveform-attribute values of the audio segment's waveform attributes, where an audio stream defines the sequence of audio segments over time, and where each audio segment defines a waveform having a plurality of waveform attributes and, for each waveform attribute in the plurality, having a respective waveform-attribute value as a characteristic of the audio segment. Further, at block 504, the method includes computing a first distance between the determined set of waveform-attribute values and a first predefined set of waveform-attribute values representative of speech, and computing a second distance between the determined set of waveform-attribute values and a second predefined set of waveform-attribute values representative of music. Additionally, at block 506, the method includes using the computed first and second distances as a basis to classify the audio segment as primarily speech or rather primarily music. And at block 508, the method includes controlling, based on the classifying, whether or not to enhance the audio segment for output.

In line with the discussion above, the act of using the first and second distances as a basis to classify the audio segment as primarily speech or rather primarily music could involve determining a classification value corresponding to a comparison of the computed first distance and the computed second distance, comparing the determined classification value to a threshold value; and deciding, based on the comparing, whether the audio segment is primarily speech or rather primarily music.

In addition, as discussed above, the act of deciding, based on the comparing, whether the audio segment is primarily speech or rather primarily music could involve making a determination of whether the classification value is greater than a predefined threshold value, and, responsive to determination being that the classification value is greater than the predefined threshold value, deciding that the audio segment is primarily speech.

Further, as indicated above, the act of controlling, based on the classifying, whether or not to enhance the audio segment could involve, if the audio segment is classified as primarily speech rather than primarily music, then applying speech-enhancement to the audio segment, and, if the audio segment is classified as primarily music rather than primarily speech, then not applying speech-enhancement to the audio segment. And applying speech-enhancement to the audio segment could take at least a predetermined length of time, and the act of not applying speech enhancement could include delaying output of the audio segment by at least the predetermined length of time.

Yet further, the act of determining the set of waveform-attribute values of the audio segment's waveform attributes could include determining the set of waveform-attribute values without computing a Fourier Transform based on the audio segment.

In addition, as discussed, at least one of the waveform attributes could be variance in linear-prediction coefficients, pseudo-maximum likelihood threshold ratio, and pitch-frequency distribution maximum level.

Still further, determining the set of waveform-attribute values of the audio segment's waveform attributes could include determining the at least one of the waveform attributes using a pseudo-maximum likelihood method.

Additionally, computing the first distance between the determined set of waveform-attribute values and the first predefined set of waveform-attribute values representative of speech could include calculating a first Mahalanobis distance between the determined set of waveform-attribute values and a first predefined set of waveform-attribute values representative of speech. And computing a second distance between the determined set of waveform-attribute values and the second predefined set of waveform-attributes representative of speech could include calculating a second Mahalanobis distance between the determined set of waveform-attribute values and a second predefined set of waveform-attribute values representative of music.

Further, the audio stream could include a first audio segment followed immediately by a second audio segment, where the method could further include (i) determining that a classification of the first audio segment as primarily speech or primarily music is different from a classification of the second audio segment as primarily speech or primarily music, and (ii) in response to the determination that the classification of the first audio segment is different than the classification of the second audio segment, crossfading between applying speech enhancement and not applying speech enhancement.

Still further, the method could be carried out during presentation of the audio stream. Additionally or alternatively, the method could be carried out before presentation of the audio stream.

In addition, the audio stream could comprise a plurality of waveforms over a plurality of channels, where the method is carried out for the plurality of waveforms.

Further, the method could be carried out in response to receiving user input requesting application of an audio-dialogue-enhancement mode.

Although the examples and features described above have been described in connection with specific entities and specific operations, in practice, there are likely to be many instances of these entities and many instances of these operations being performed, perhaps contemporaneously or simultaneously, on a large-scale basis. Indeed, in practice, the computing system 100 is likely to represent any one of many content-distribution systems (each potentially transmitting content on many channels) and/or many content-presentation devices, with some or all of the described operations being performed on a routine and repeating basis in connection with some or all of these entities.

In addition, although some of the operations described in this disclosure have been described as being performed by a particular entity, the operations could be performed by any entity, such as the other entities described in this disclosure. Further, although the operations have been recited in a particular order and/or in connection with example temporal language, the operations need not be performed in the order recited and need not be performed in accordance with any particular temporal restrictions. However, in some instances, it could be desired to perform one or more of the operations in the order recited, in another order, and/or in a manner where at least some of the operations are performed contemporaneously/simultaneously. Likewise, in some instances, it could be desired to perform one or more of the operations in accordance with one more or the recited temporal restrictions or with other timing restrictions. Further, each of the described operations could be performed responsive to performance of one or more of the other described operations. Also, not all of the operations need to be performed to achieve one or more of the benefits provided by the disclosure, and therefore not all of the operations are required.

Although certain variations have been described in connection with one or more examples of this disclosure, these variations could also be applied to some or all of the other examples of this disclosure as well and therefore aspects of this disclosure could be combined and/or arranged in many ways. The examples described in this disclosure were selected at least in part because they help explain the practical application of the various described features.

Also, although select examples of this disclosure have been described, alterations and permutations of these examples will be apparent to those of ordinary skill in the art. Other changes, substitutions, and/or alterations are also possible without departing from the invention in its broader aspects as set forth in the claims.

The invention claimed is:

1. A method for dynamically controlling enhancement of an audio stream, wherein the audio stream defines a sequence of audio segments over time, including at least a first audio segment and a second audio segment, and wherein each audio segment defines a waveform having a plurality of waveform attributes and, for each waveform attribute in the plurality, having a respective waveform-attribute value as a characteristic of the audio segment, the method comprising, for each audio segment of the sequence of audio segments, (i) determining a set of the waveform-attribute values of the audio segment's waveform attributes, (ii) computing a first distance between the determined set of waveform-attribute values and a first predefined set of waveform-attribute values representative of speech, and computing a second distance between the determined set of waveform-attribute values and a second predefined set of waveform-attribute values representative of music, and (iii) using the computed first and second distances as a basis to classify the audio segment as primarily speech or rather primarily music, wherein the first audio segment is classified as primarily speech rather than primarily music, and wherein the second audio segment is classified as primarily music rather than primarily speech; and based at least on the first audio segment being classified as primarily speech rather than primarily music, applying speech enhancement to the first audio segment, wherein applying speech-enhancement to the first audio segment takes at least a predetermined length of time; and based at least on the second audio segment being classified as primarily music rather than primarily speech, not applying speech enhancement to the second audio segment, wherein not applying speech enhancement to the second audio segment comprises delaying output of the second audio segment by at least the predetermined length of time.

2. The method of claim 1, wherein using the computed first and second distances as a basis to classify the audio segment as primarily speech or rather primarily music comprises:
   determining a classification value corresponding to a comparison of the computed first distance and the computed second distance;
   comparing the determined classification value to a threshold value; and
   deciding, based on the comparing, whether the audio segment is primarily speech or rather primarily music.

3. The method of claim 2, wherein deciding, based on the comparing, whether the audio segment is primarily speech or rather primarily music comprises:
   making a determination of whether the classification value is greater than a predefined threshold value;
   responsive to determination being that the classification value is greater than the predefined threshold value, deciding that the audio segment is primarily speech.

4. The method of claim 1, wherein determining the set of waveform-attribute values of the audio segment's waveform attributes comprises determining the set of waveform-attribute values without computing a Fourier Transform based on the audio segment.

5. The method of claim 1, wherein at least one of the waveform attributes is selected from a group consisting of variance in linear-prediction coefficients, pseudo-maximum likelihood threshold ratio, and pitch-frequency distribution maximum level.

6. The method of claim 5, wherein determining the set of waveform-attribute values of the audio segment's waveform attributes comprises determining the at least one of the waveform attributes using a pseudo-maximum likelihood method.

7. The method of claim 1,
   wherein computing the first distance between the determined set of waveform-attribute values and the first predefined set of waveform-attribute values representative of speech comprises calculating a first Mahalanobis distance between the determined set of waveform-attribute values and a first predefined set of waveform-attribute values representative of speech, and
   wherein computing the second distance between the determined set of waveform-attribute values and the second predefined set of waveform-attributes representative of speech comprises calculating a second Mahalanobis distance between the determined set of waveform-attribute values and a second predefined set of waveform-attribute values representative of music.

8. The method of claim 1, wherein the the first and second audio segments are adjacent to each other in the sequence of audio segments, and wherein the method further comprises:
   based on the classification of the first audio segment being different than the classification of the second audio segment, crossfading between applying speech enhancement and not applying speech enhancement.

9. The method of claim 1, wherein the method is carried out during presentation of the audio stream.

10. The method of claim 1, wherein the method is carried out before presentation of the audio stream.

11. The method of claim 1, wherein the audio stream comprises a plurality of waveforms over a plurality of channels, wherein the method is carried out for the plurality of waveforms.

12. The method of claim 1, wherein the method is carried out in response to receiving user input requesting application of an audio-dialogue-enhancement mode.

13. A non-transitory computer-readable storage medium, having stored thereon program instructions that, upon execution by one or more processors, cause performance of a set of operations for dynamically controlling enhancement of an audio stream, wherein the audio stream defines a sequence of audio segments over time, and wherein each audio segment defines a waveform having a plurality of waveform attributes and, for each waveform attribute in the plurality, having a respective waveform-attribute value as a characteristic of the audio segment, the operations comprising, for each audio segment of the sequence of audio segments:
   determining a set of the waveform-attribute values of the audio segment's waveform attributes;
   computing a first distance between the determined set of waveform-attribute values and a first predefined set of waveform-attribute values representative of speech, and computing a second distance between the determined set of waveform-attribute values and a second predefined set of waveform-attribute values representative of music;
   using the computed first and second distances as a basis to classify the audio segment as primarily speech or rather primarily music; and
   controlling, based on the classifying, whether or not to enhance the audio segment for output, wherein the controlling includes (i) if the audio segment is classified as primarily speech rather than primarily music, then applying speech-enhancement to the audio segment and (ii) if the audio segment is classified as primarily music rather than primarily speech, then not applying speech-enhancement to the audio segment,
   wherein applying speech-enhancement to the audio segment takes at least a predetermined length of time, and wherein not applying speech enhancement comprises delaying output of the audio segment by at least the predetermined length of time.

14. The non-transitory computer-readable storage medium of claim 13, wherein using the computed first and second distances as a basis to classify the audio segment as primarily speech or rather primarily music comprises:
   determining a classification value corresponding to a comparison of the computed first distance and the computed second distance;
   comparing the determined classification value to a threshold value; and deciding, based on the comparing, whether the audio segment is primarily speech or rather primarily music.

15. The non-transitory computer-readable storage medium of claim 13,
wherein computing the first distance between the determined set of waveform-attribute values and the first predefined set of waveform-attribute values representative of speech comprises calculating a first Mahalanobis distance between the determined set of waveform-attribute values and a first predefined set of waveform-attribute values representative of speech, and
wherein computing the second distance between the determined set of waveform-attribute values and the second predefined set of waveform-attributes representative of speech comprises calculating a second Mahalanobis distance between the determined set of waveform-attribute values and a second predefined set of waveform-attribute values representative of music.

16. The non-transitory computer-readable storage medium of claim 13, wherein the audio stream comprises a first audio segment followed immediately by a second audio segment, wherein the set of operations further comprises:
determining that a classification of the first audio segment as primarily speech or primarily music is different from a classification of the second audio segment as primarily speech or primarily music;
in response to the determination that the classification of the first audio segment is different than the classification of the second audio segment, crossfading between applying speech enhancement and not applying speech enhancement.

17. A computing system comprising:
one or more processors; and
one or more non-transitory computer-readable storage mediums, having stored thereon program instructions that, upon execution by the one or more processors, cause performance of a set of operations for dynamically controlling enhancement of an audio stream, wherein the audio stream defines a sequence of audio segments over time, and wherein each audio segment defines a waveform having a plurality of waveform attributes and, for each waveform attribute in the plurality, having a respective waveform-attribute value as a characteristic of the audio segment, the operations comprising, for each audio segment of the sequence of audio segments:
determining a set of the waveform-attribute values of the audio segment's waveform attributes;
computing a first distance between the determined set of waveform-attribute values and a first predefined set of waveform-attribute values representative of speech, and computing a second distance between the determined set of waveform-attribute values and a second predefined set of waveform-attribute values representative of music;
using the computed first and second distances as a basis to classify the audio segment as primarily speech or rather primarily music; and
controlling, based on the classifying, whether or not to enhance the audio segment for output, wherein the controlling includes (i) if the audio segment is classified as primarily speech rather than primarily music, then applying speech-enhancement to the audio segment and (ii) if the audio segment is classified as primarily music rather than primarily speech, then not applying speech-enhancement to the audio segment,
wherein applying speech-enhancement to the audio segment takes at least a predetermined length of time, and wherein not applying speech enhancement comprises delaying output of the audio segment by at least the predetermined length of time.

* * * * *